(12) United States Patent
Katsura et al.

(10) Patent No.: US 6,449,471 B1
(45) Date of Patent: Sep. 10, 2002

(54) WIRELESS TERMINAL DEVICE

(75) Inventors: Takatoshi Katsura; Kenji Itoh; Shinjirou Fukuyama; Mitsuru Mochizuki; Hiroaki Nagano; Yoshinori Matsunami; Mitsuhiro Shimozawa; Fumio Ishizu; Ryoji Hayashi, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 121 days.

(21) Appl. No.: 09/707,942

(22) Filed: Nov. 8, 2000

Related U.S. Application Data

(63) Continuation of application No. PCT/JP99/01203, filed on Mar. 11, 1999.

(51) Int. Cl.[7] .................................................. H03D 3/00
(52) U.S. Cl. ...................... 455/324; 455/304; 455/323; 329/304; 375/329
(58) Field of Search .............................. 455/266, 234.1, 455/304, 324, 315, 323, 313–317, 230, 205, 234.2, 232.1; 329/323, 346, 358, 304, 306, 307; 375/320–329, 316, 322, 344, 361

(56) References Cited

U.S. PATENT DOCUMENTS 5,787,126 A * 7/1998 Itoh et al. .................... 329/306
6,127,884 A * 10/2000 Rishi ........................... 329/304
6,133,964 A * 10/2000 Han .............................. 348/726
6,148,039 A * 11/2000 Coman et al. ................. 331/17
6,236,848 B1 * 5/2001 Igarashi et al. .............. 375/329

FOREIGN PATENT DOCUMENTS

| JP | 7-95110 | 4/1995 |
|----|---------|--------|
| JP | 7-283656 | 10/1995 |
| JP | 8-242261 | 9/1996 |
| JP | 9-83595 | 3/1997 |
| JP | 9-200072 | 7/1997 |
| JP | 10-13482 | 1/1998 |
| JP | 10-56394 | 2/1998 |
| JP | 10-233711 | 9/1998 |

* cited by examiner

*Primary Examiner*—Thanh Cong Le
*Assistant Examiner*—Pablo N Tran
(74) *Attorney, Agent, or Firm*—Rothwell, Figg, Ernst & Manbeck

(57) ABSTRACT

In a cellular telephone having a receiving circuit of a direct conversion type using an even harmonic orthogonal mixer, high-pass filters for removing a DC offset component are arranged before and after a variable gain amplifier in a base band circuit. The DC offset component occurred in the even harmonic orthogonal mixer is always constant, and the DC offset component occurred in the variable gain amplifier frequently varies so that a cutoff frequency of the front high-pass filter is set to be lower than a cutoff frequency of the rear high-pass filter, and the frequencies are set to achieve a fast transition response.

7 Claims, 5 Drawing Sheets

WIRELESS TERMINAL DEVICE

REFERENCE TO RELATED APPLICATION

This Application is a continuation of International Application No. PCT/JP99/01203, whose international filing date is Mar. 11, 1999, the disclosure of which is incorporated by reference herein.

BACKGROUND OF THE INVENTION

1. Field of the Invention

The present relates to a wireless terminal device, and particularly a wireless terminal device which is provided with a direct conversion receiving circuit using an even harmonic mixer.

2. Description of the Background Art

At present, wireless terminal devices such as a cellular telephone primarily employ receiving circuits of a heterodyne type. Although the heterodyne type requires an intermediate frequency circuit, a local oscillation signal does not leak toward an antenna, and therefore, deterioration in sensitivity due to the leakage does not occur because a local oscillation frequency is different from a receiving frequency.

In contrast to the above, the direct conversion (homodyne) type does not require an intermediate frequency circuit, but uses the local oscillation frequency equal to the receiving frequency. Therefore, the local oscillation signal may leak toward the antenna, and thereby the sensitivity may be deteriorated.

According to the heterodyne type, the intermediate frequency signal in the intermediate frequency circuit is converted to a base band signal of a low frequency, and is applied to a base band circuit. The base band signal applied to the base band circuit is kept at a constant level by a variable gain amplifier in the intermediate frequency circuit. Therefore, the level of the base band signal hardly varies in the base band circuit.

In contrast to this, the direct conversion type does not use the intermediate frequency circuit, and the received radio-frequency signal is directly converted to the base band signal of a low frequency. Therefore, the levels of the base band signal applied to the base band circuit varies when the level of the received radio-frequency signal varies.

In general, when an input signal is applied to a circuit element, an output signal contains an unnecessary DC offset component in addition to a desired signal component. According to the heterodyne type described above, since the base band signal applied to the base band circuit is at a constant level, the DC offset component contained in the output signal is constant. Therefore, the base band circuit can be designed in view of such a constant DC offset component.

According to the direct conversion type, however, the level of the base band signal applied to the base band circuit is variable. Therefore, the DC offset component contained in the output signal of the circuit element in the base band circuit is not constant, and varies to a relatively large extent. It is very difficult to design the base band circuit in view of this variation. Further, the operation of the base band circuit may be saturated due to the fact that the base band signal applied to the base band circuit contains the DC offset component.

Various manners and systems have been disclosed for preventing an influence of the DC offset component in the DC conversion system (Japanese Patent Laying-Open Nos. 10-233711, 10-13482, 9-83595 and 10-56394). However, these manners are different in principle from a manner or method according to the invention, which will be described later.

The base band signal has a low frequency, and is similar to a DC (which can be considered as an AC having a frequency of 0 Hz). Therefore, if such a manner is employed that merely removes the DC offset component, this also removes the signal component of the base band signal. If the cut-off frequency is lowered toward 0 Hz as far as possible, the signal component is hardly removed, but a transition response becomes slow.

This results in deterioration of operation characteristics of the base band circuit.

SUMMARY OF THE INVENTION

An object of the invention is to provide a wireless terminal device, in which only a DC offset component can be removed without slowing a transition response.

According to the invention, a wireless terminal device includes an antenna, and a receiving circuit for receiving a received radio-frequency signal from the antenna. The receiving circuit includes a local oscillator, an even harmonic mixer, a first high-pass filter, a variable gain amplifier and a second high-pass filter. The even harmonic mixer mixes the received radio-frequency signal with a local oscillation signal supplied from the local oscillator to produce a base band signal. The first high-pass filter receives the base band signal from the even harmonic mixer, and has a first cut-off frequency. The variable gain amplifier amplifies the first base band signal passed through the first high-pass filter to obtain a constant output level. The second high-pass filter receives the base band signal from the variable gain amplifier, and has a second cut-off frequency higher than the first cut-off frequency.

In the wireless terminal device described above, the first high-pass filter removes the DC offset component occurred in the even harmonic mixer. Since the first high-pass filter has a lower cut-off frequency than the second high-pass filter, only the DC offset component can be reliably removed without substantially removing the signal component. Since the first high-pass filter has a low cut-off frequency, its transition response is slow, but the circuit operation speed does not decrease because the DC offset component occurred in the even harmonic mixer is constant even when the level of the received radio-frequency signal varies. Meanwhile, the DC offset component occurred in the variable gain amplifier is removed by the second high-pass filter. Although the level of the DC offset component occurred in the variable gain amplifier varies, this DC offset component can be reliably removed with a high transition response because the second high-pass filter has a higher frequency than the first high-pass filter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A cellular telephone according to an embodiment of the invention will be described below with reference to the drawings. In the figures, the same or corresponding portions bear the same reference numbers, and description thereof is not repeated.

Figure 1:
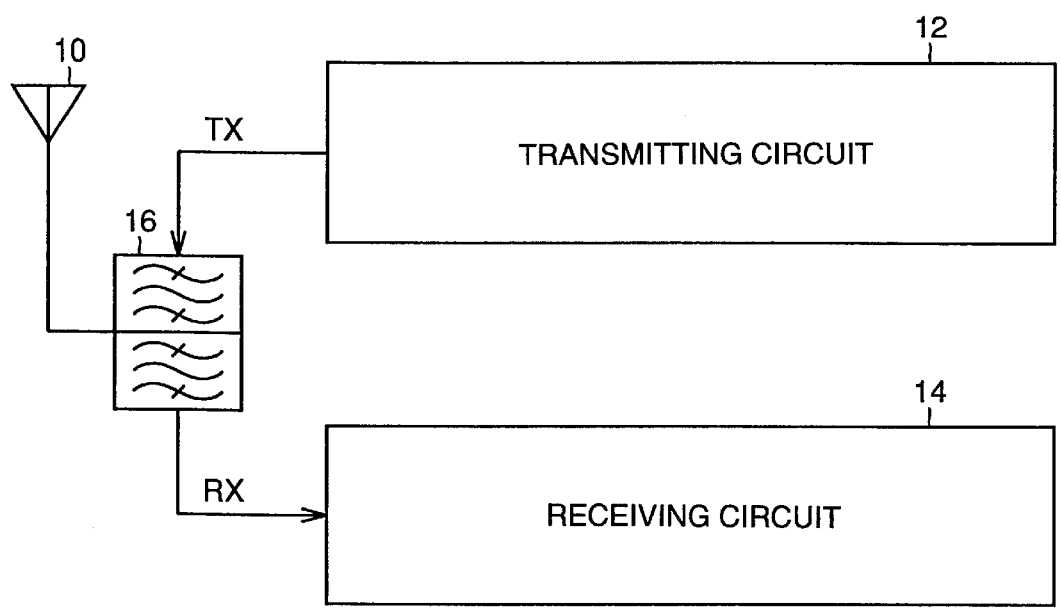
FIG. 1 is a block diagram showing a whole structure of a cellular telephone according to an embodiment of the invention.

Referring to FIG. 1, a cellular telephone which is a kind of wireless terminal device includes an antenna 10, a transmitting circuit 12, a receiving circuit 14 and a transmission/reception branching filter 16.

This cellular telephone employs a CDMA (Code Division Multiple Access) scheme, and simultaneously performs transmission and reception via single antenna 10. Therefore, the transmitting frequency is different from the receiving frequency and, in this embodiment, is lower than the receiving frequency. Therefore, the transmission/reception branching filter 16 is formed of a band-pass filter passing only a transmitting wave TX therethrough and a band-pass filter passing only a received wave RX therethrough, and hardly passes transmitting wave TX toward receiving circuit 14.

Figure 2:
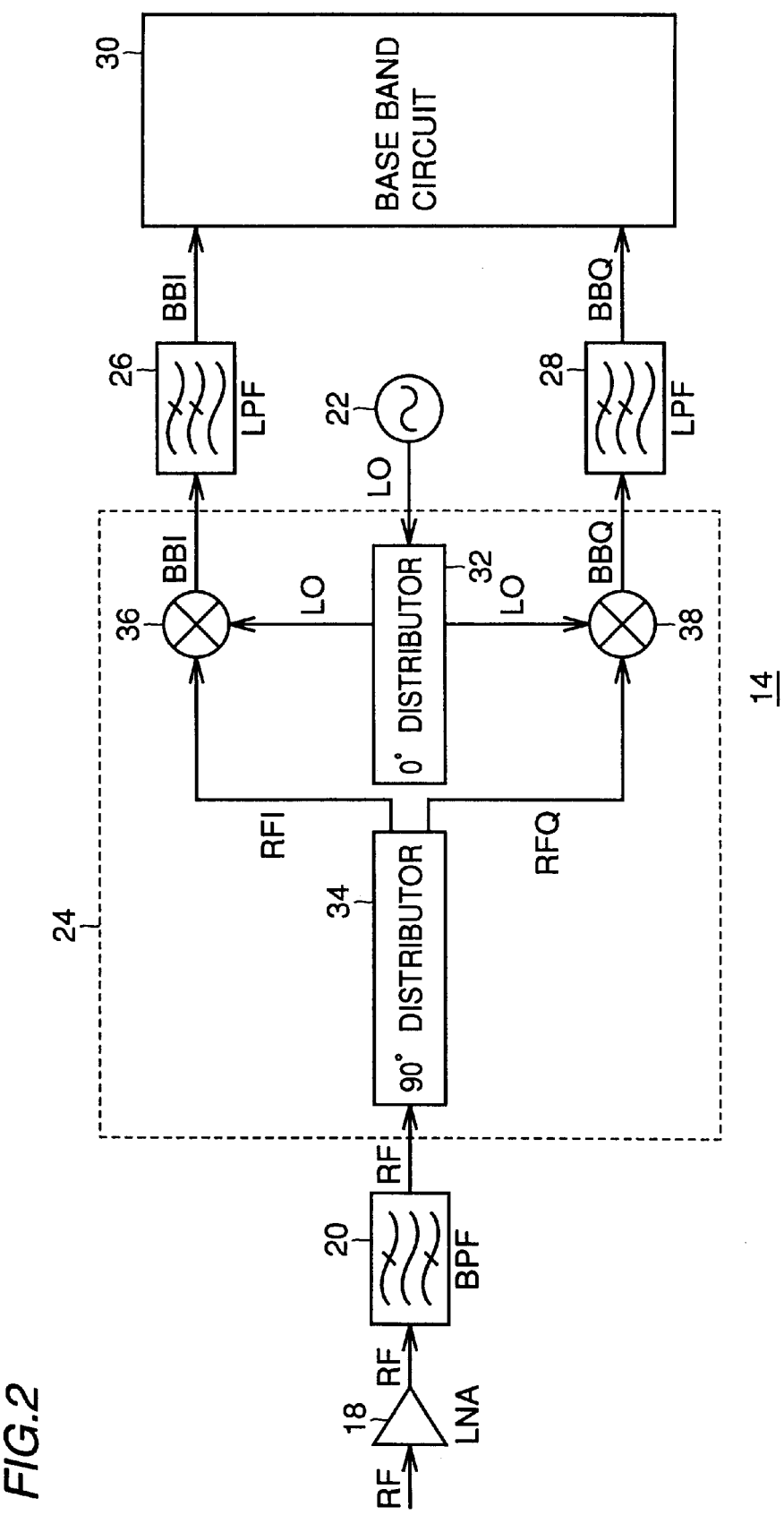
FIG. 2 is a block diagram showing a specific structure of a receiving circuit shown in FIG. 1.

Referring to FIG. 2, receiving circuit 14 includes a low-noise amplifier (LNA) 18, a band-pass filter (BPF) 20, a local oscillator 22, an even harmonic orthogonal mixer 24, passive low-pass filters (LPF) 26 and 28, and a base band circuit 30.

Low-noise amplifier 18 amplifies received wave RX (which will be referred to as a "received radio-frequency signal RF" hereinafter) passed through transmission/reception branching filter 16. Band-pass filter 20 removes unnecessary signals, and passes only necessary received radio-frequency signal RF. Local oscillator 22 oscillates a local oscillation signal LO. A frequency flo of local oscillation signal LO is equal to half a frequency frf of received radio-frequency signal RF. Even harmonic orthogonal mixer 24 mixes received radio-frequency signal RF, which is passed through band-pass filter 20, with local oscillation signal LO sent from local oscillator 22, and thereby converts the received radio-frequency to the base band frequency for producing an I-channel base band signal BBI and a Q-channel base band signal BBQ. Q- and I-channel base band signals BBQ and BBI have phases shifted by 90° from each other.

Low-pass filter 26 receives an I-channel base band signal BBI sent from even harmonic orthogonal mixer 24, and passes only a desired channel and its neighboring channel by suppressing jamming waves exceeding the neighboring channel. Low-pass filter 28 receives a Q-channel base band signal BBQ from even harmonic orthogonal mixer 24, and passes only a desired channel and its neighboring channel by suppressing jamming waves exceeding the neighboring channel. The frequencies of low-pass filters 26 and 28 are equal to each other.

Even harmonic orthogonal mixer 24 includes an in-phase (0°) distributor 32, a 90° distributor 34, and even harmonic mixers 36 and 38. In-phase distributor 32 distributes local oscillation signal LO sent from local oscillator circuit 22 to even harmonic mixers 36 and 38. Local oscillation signals LO applied to even harmonic mixers 36 and 38 have the same phase.

Ninety-degree distributor 34 produces an I-channel radio-frequency signal RFI and a Q-channel radio-frequency signal RFQ, which have phases shifted by 90° from each other, based on received radio-frequency signal RF passed through band-pass filter 20. Even harmonic mixer 34 mixes I-channel radio-frequency signal RFI sent from 90° distributor 34 with local oscillation signal LO sent from in-phase distributor 32, and thereby converts the radio-frequency to the base band frequency for producing I-channel base band signal BBI. Even harmonic mixer 38 mixes Q-channel radio-frequency signal RFQ sent from 90° distributor 34 with local oscillation signal LO sent from in-phase distributor 32, and thereby converts the radio-frequency to the base band frequency for producing Q-channel base band signal BBQ.

Instead of in-phase distributor 32, a 45° distributor may be provided, and an in-phase (0°) distributor may be provided instead of 90° distributor 34. In the case where an a-degree distributor (32) and a b-degree distributor (34) are employed, it is merely required to satisfy a relationship of $|2 \times a - b| = 90°$.

Figure 3:
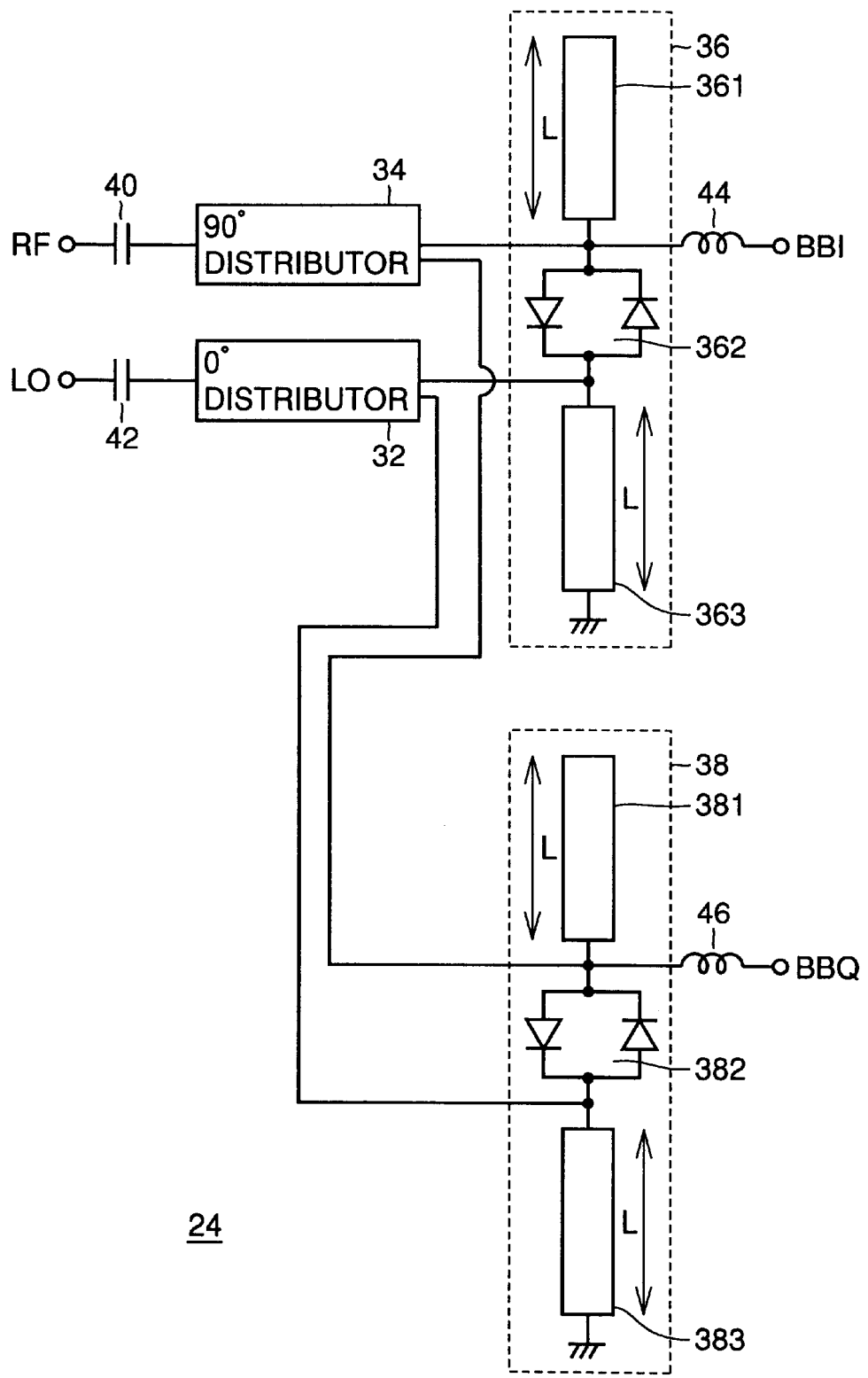
FIG. 3 is a block diagram showing a specific structure of an even harmonic orthogonal mixer shown in FIG. 2.

Referring to FIG. 3, even harmonic mixer 36 includes an end-open stub 361, an anti-parallel diode pair 362 and an end-shorted stub 363. Likewise, even harmonic mixer 38 includes an end-open stub 381, an anti-parallel diode pair 382 and an end-shorted stub 383. Each of stubs 361, 363, 381 and 383 has a length L equal to a quarter of a wavelength of local oscillation signal LO, and thus is nearly equal to half the wavelength of received radio-frequency signal RF.

Received radio-frequency signal RF is applied to 90° distributor 34 via a capacitor 40 for cutting a DC component. Local oscillation signal LO is applied to in-phase distributor 32 via a capacitor 42 for cutting a DC component. I-channel base band signal BBI produced by even harmonic mixer 36 is issued via a choke coil 44 for cutting an radio-frequency (RF) component. Q-channel base band signal BBQ produced by even harmonic mixer 38 is issued via a choke coil 46 for cutting a radio-frequency (RF) component.

Operations of the even harmonic mixers will now be described briefly. Assuming that the supplied radio-frequency signal RF has a frequency of frf, and the supplied local oscillation signal LO has a frequency of flo, the output base band signal has a frequency fbb expressed by the following formula:

$$fbb = m \cdot frf \pm n \cdot flo$$

where m and n are integers, respectively.

In the even harmonic mixer, a frequency conversion efficiency is low when (m+n) is an even number, and the frequency conversion efficiency is high when (m+n) is an odd number. This is because a mixed wave current in the case of the even number forms a loop current flowing through anti-parallel diode pairs 362 and 382, and is not externally output.

More specifically, in the case of m=1 and n=2, the base band signal has frequency fbb expressed by the following formula:

$$fbb = frf - 2 \cdot flo$$

Since there is a relationship of flo=frf/2 as described above, a base band signal of a low frequency (fbb=0) can be obtained with a high conversion efficiency.

Accordingly, the radio-frequency received by antenna 10 is directly converted to a low frequency without being temporarily converted to an intermediate frequency. Further, leakage of the local oscillation signal toward antenna 10, which may deteriorate the sensitivity, does not occur because local oscillation frequency flo is equal to half the received frequency frf.

Even harmonic orthogonal mixer 24 shown in FIG. 3 is the same as that shown in FIG. 40 of U.S. Pat. No. 5,787,126 (Japanese Patent Laying-Open No. 8-242261), and therefore is not described in further greater detail.

Figure 4:
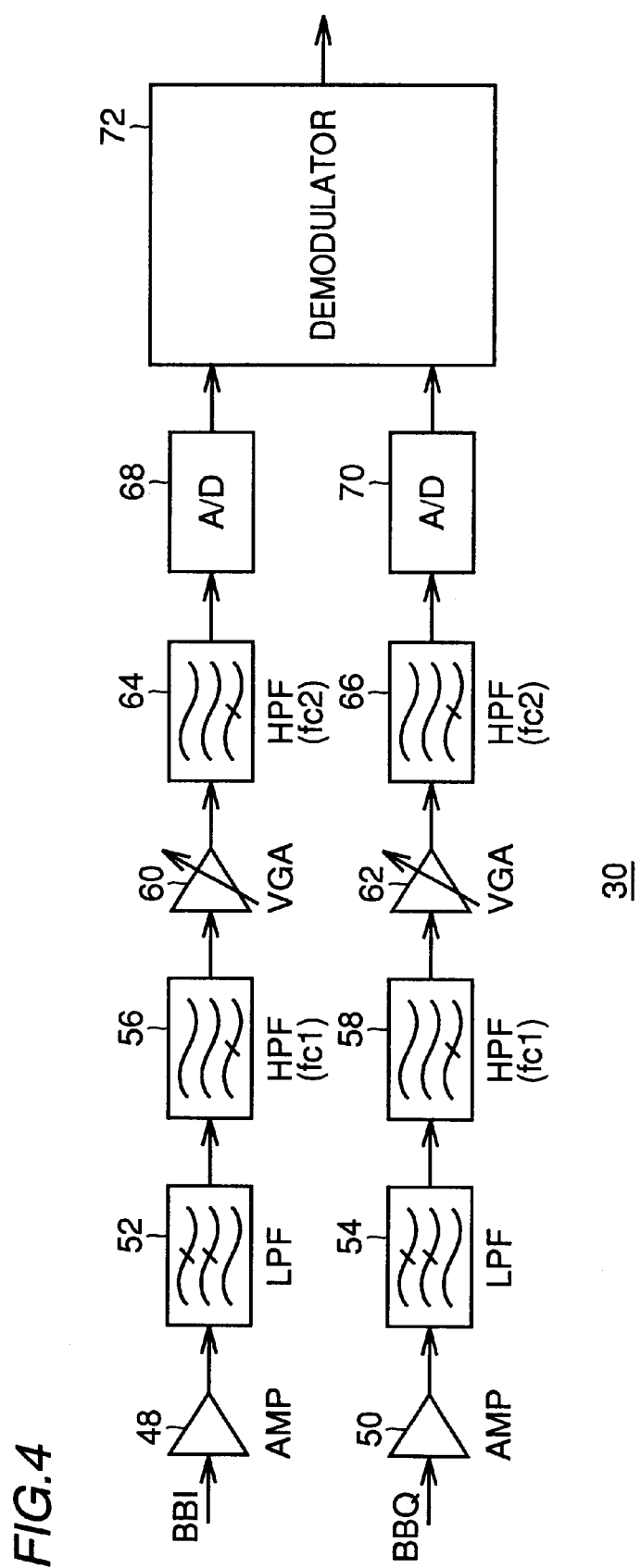
FIG. 4 is a block diagram showing a specific structure of a base band circuit shown in FIG. 2.

Referring to FIG. 4, base band circuit 30 includes amplifiers (AMP) 48 and 50, active low-pass filters (LPF) 52 and 54, front high-pass filters (HPF) 56 and 58, variable gain amplifiers (VGA) 60 and 62, rear high-pass filters (HPF) 64 and 66, AD converters 68 and 70, and a demodulator 72.

Amplifier 48 amplifies I-channel base band signal BBI sent from low-pass filter 26 with a high SN ratio, and applies it to low-pass filter 52. Amplifier 50 amplifies Q-channel base band signal BBQ sent from low-pass filter 28 with a high SN ratio, and applies it to low-pass filter 54.

Low-pass filter 52 receives I-channel base band signal BBI sent from amplifier 48, and removes jamming waves including and exceeding the neighboring channel for passing only the desired channel. Low-pass filter 54 receives Q-channel base band signal BBQ sent from amplifier 50, and removes jamming waves including or exceeding the neighboring channel for passing only the desired channel.

High-pass filter 56 receives I-channel base band signal BBI from low-pass filter 52, and removes a DC offset component contained in I-channel base band signal BBI. High-pass filter 58 receives Q-channel base band signal BBQ from low-pass filter 54, and removes a DC offset component contained in Q-channel base band signal BBQ. Cut-off frequency fc1 of high-pass filter 56 is set to be substantially equal to cut-off frequency fc1 of high-pass filter 58.

Variable gain amplifier 60 amplifies the I-channel base band signal passed through high-pass filter 56, and thereby obtains the output signal at a constant level. Thus, variable gain amplifier 60 amplifies I-channel base band signal BBI sent from high-pass filter 56 with an appropriate gain so that the output level of AD converter 68 may always be constant. Variable gain amplifier 62 amplifies Q-channel base band signal BBQ passed through high-pass filter 58 to obtain a constant output level. More specifically, variable gain amplifier 62 amplifies Q-channel base band signal BBQ sent from high-pass filter 58 with an appropriate gain so that the output level of AD converter 70 may always be constant.

Rear high-pass filter 64 receives I-channel base band signal BBI sent from variable gain amplifier 60, and removes a DC offset component contained in I-channel base band signal BBI. Rear high-pass filter 66 receives Q-channel base band signal BBQ sent from variable gain amplifier 62, and removes a DC offset component contained in Q-channel base band signal BBQ. High-pass filters 64 and 66 have equal cut-off frequencies fc2, respectively. However, cut-off frequencies fc2 of rear high-pass filters 64 and 66 are set to be higher than cut-off frequencies fc1 of front high-pass filters 56 and 58. The reason for establishing the above relationship between the cut-off frequencies fc1 and fc2 will be described later.

AD converter 68 performs A/D conversion of I-channel base band signal BBI passed through high-pass filter 64, and applies it to modulator 72. AD converter 70 performs A/D conversion of Q-channel base band signal BBQ passed through high-pass filter 66, and applies it to modulator 72. Demodulator 72 demodulates I-channel base band signal BBI sent from AD converter 68 and Q-channel base band signal BBQ sent from AD converter 70, and thereby produces low-frequency (audio) signals.

Operations of the cellular telephone having the above structure will now be described.

Received radio-frequency signal RF obtained by antenna 10 is amplified by low-noise amplifier 18, and then is applied to even harmonic orthogonal mixer 24 via band-pass filter 20. Even harmonic orthogonal mixer 24 performs frequency conversion from received radio-frequency signal RF to base band signals BBI and BBQ. More specifically, received radio-frequency signal RF applied to even harmonic orthogonal mixer 24 is distributed to even harmonic mixers 36 and 38 with different phases, respectively. I-channel radio-frequency signal RFI sent from 90° distributor 34 is directly converted to I-channel base band signal BBI of a low frequency by even harmonic mixer 36. Q-channel radio-frequency signal RFQ sent from 90° distributor 34 is directly converted to Q-channel base band signal BBQ of a low frequency by even harmonic mixer 38. Since local oscillation frequency flo is equal to half the frequency frf of received radio-frequency signal RF, even harmonic mixers 36 and 38 hardly perform secondary (even-numbered order) frequency conversion even when local oscillation signal LO leaks to antenna 10. As a result, unnecessary leaked signals do not reach base band circuit 30. As described above, such a situation does not occur that the leakage of local oscillation signal LO deteriorates the sensitivity.

I-channel base band signal BBI and Q-channel base band signal BBQ produced in even harmonic orthogonal mixer 24 are applied to base band circuit 30 via passive low-pass filters 26 and 28, respectively. These low-pass filters 26 and 28 remove jamming waves of or above the next neighboring channel contained in base band signals BBI and BBQ, respectively.

I-channel base band signal BBI applied to base band circuit 30 is amplified by amplifier 48, and is applied to variable gain amplifier 60 via active low-pass filter 52 and front high-pass filter 56. I-channel base band signal BBI thus applied is appropriately amplified by variable gain amplifier 60, and is applied to AD converter 68 via rear high-pass filter 64. I-channel base band signal BBI thus applied is A/D-converted by AD converter 68, and then is applied to demodulator 72. Q-channel base band signal BBQ applied to base band circuit 30 is amplified by amplifier 50, and is applied to variable gain amplifier 62 via active low-pass filter 54 and front high-pass filter 58. Variable gain amplifier 62 appropriately amplifies Q-channel base band signal BBQ applied thereto, and applies it to AD converter 70 via rear high-pass filter 66. AD converter 70 performs A/D conversion of Q-channel base band signal BBQ applied thereto, and applies it to demodulator 72. These A/D-converted base band signals are demodulated by demodulator 72 to low-frequency (audio) signals.

Active low-pass filters 52 and 54 described above remove jamming waves of the neighboring channels passed through passive low-pass filters 26 and 28, and only the desired channels are applied to high-pass filters 56 and 58, respectively.

Front high-pass filters 56 and 58 remove DC offset components which primarily occurred in even harmonic orthogonal mixer 24, and rear high-pass filters 64 and 66 remove DC offset components which primarily occurred in variable gain amplifiers 60 and 62.

Figure 5:
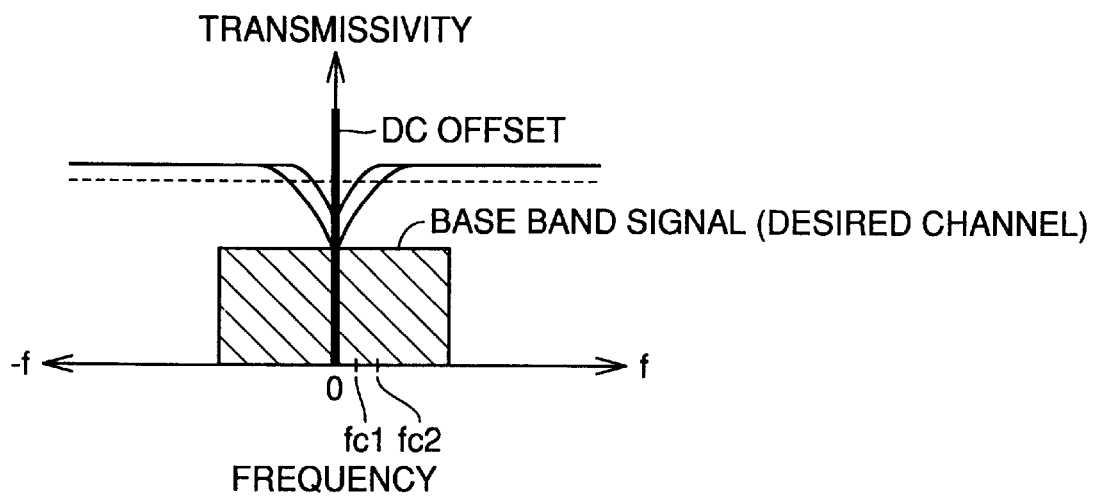
FIG. 5 shows frequency characteristics of a high-pass filter shown in FIG. 4.

Since front high-pass filters 56 and 58 as well as rear high-pass filters 64 and 66 are all provided for the purpose of removing DC offset components, it is desired to set offset frequencies fc1 and fc2 as low as possible so that the base band signal component may not be removed as shown in FIG. 5. However, as the offset frequencies of high-pass filters 56, 58, 64 and 66 are lowered, the transition response becomes slower so that the DC offset component cannot be removed rapidly. Accordingly, cut-off frequencies fc1 and fc2 must be set to satisfy the foregoing contradictory requirements. In this example, cut-off frequencies fc1 of front high-pass filters 56 and 58 are set to be lower than cut-off frequencies fc2 of rear high-pass filters 64 and 66. The reason for this is as follows.

Front high-pass filters 56 and 58 are provided for removing the DC offset voltages occurred in even harmonic orthogonal mixer 24, and these DC offset voltages to be removed are always constant regardless of the base band signal unless mixer 24 is saturated. This is because the DC offset voltage is formed of a product of local oscillator signal LO applied from local oscillator 22 and local oscillation signal LO leaked to antenna 10. An experiment was performed for confirming that the DC offset voltage occurred in even harmonic orthogonal mixer 24 is constant. A result of this experiment will now be described.

In the experiment, even harmonic orthogonal mixer 24 shown in FIG. 3 was provided with capacitors 40 and 42 each having a capacitance of 10 pF, choke coils 44 and 46 each having an inductance of 0.1 $\mu$H, and anti-parallel diode pairs 362 and 382 formed of BAT14-099 manufactured by Siemens Corporation. Even harmonic orthogonal mixer 24 was supplied with radio-frequency signal RF of 2140.050 MHz with an intensity from −100 to −20 dBm, and was also supplied with local oscillation signal LO of 1070.000 MHz (nearly equal to frt/2) at a constant intensity. Thereby, substantially constant DC offset voltages were obtained as shown in the following table.

TABLE

RF Power Dependency of DC Offset Voltage

| RF (dBm) | DC Offset Vol (mVrms) |
|---|---|
| −100 | 0.06 |
| −40 | 0.07 |
| −35 | 0.06 |
| −30 | 0.06 |
| −25 | 0.07 |
| −21 | 0.06 |
| −20 | 0.05 |

Rear high-pass filters 64 and 66 are provided for the purpose of removing DC offset voltages occurred in variable gain amplifiers 60 and 62, respectively. However, the DC offset voltages occurred in variable gain amplifiers 60 and 62 frequently vary because the gains thereof frequently vary.

As described above, the DC offset voltage occurred in even harmonic orthogonal mixer 24 is always constant. Therefore, a fast transition response is not required in front high-pass filters 56 and 58. Accordingly, it is desired that offset frequencies fc1 of front high-pass filters 56 and 58 are low so that only the DC offset components can be removed without removing the base band signal component as far as possible. Meanwhile, since the DC offset voltages occurred in variable gain amplifiers 60 and 62 frequently vary, a fast transition response is required in rear high-pass filters 64 and 66. Therefore, cutoff frequencies fc2 of rear high-pass filters 64 and 66 are set to be higher than cut-off frequencies fc1 of front high-pass filters 56 and 58.

According to the embodiment described above, since receiving circuit 14 employs the direct conversion system, an intermediate frequency circuit is not required so that the embodiment can provide a cellular telephone of a small size.

Although receiving circuit 14 employs the direct conversion system, even harmonic orthogonal mixer 24 is employed so that local oscillation signal LO does not leak to antenna 10, and therefore deterioration in sensitivity due to the leakage does not occur.

In the base band circuit 30, cut-off frequencies fc1 of front high-pass filters 56 and 58 are lower than cut-off frequencies fc2 of rear high-pass filters 64 and 66. Therefore, the DC offset components occurred in even harmonic orthogonal mixer 24 and variable gain amplifiers 60 and 62 can be rapidly removed, and further the signal components in the base band are not substantially removed. As a result, the circuit operations are not saturated so that correct low-frequency (audio) signals cannot be obtained. Further, deterioration in receiving sensitivity can be prevented.

Even harmonic orthogonal mixer 24 described above employs 90° distributor 34. Alternatively, such a structure may be employed that received radio-frequency signal RF passed through band-pass filter 20 is directly applied to even harmonic mixer 36, and received radio-frequency signal RF is applied to even harmonic mixer 38 via a phase shifter which shifts the phase of received radio-frequency signal RF by 90 degrees.

The wireless terminal device according to the invention can be utilized in mobile communication terminals such as a cellular telephone.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wireless terminal device comprising:
   an antenna; and
   a receiving circuit for receiving a received radio-frequency signal from said antenna,
   said receiving circuit includes:
      a local oscillator,
      a first even harmonic mixer for mixing said received radio-frequency signal with a local oscillation signal supplied from said local oscillator to produce a first base band signal,
      a first high-pass filter for receiving the first base band signal from said first even harmonic mixer, and having a first cut-off frequency,
      a first variable gain amplifier for amplifying the first base band signal passed through said first high-pass filter to obtain a constant output level, and
      a second high-pass filter for receiving the first base band signal from said first variable gain amplifier, and having a second cut-off frequency higher than said first cut-off frequency.

2. The wireless terminal device according to claim 1, wherein
   said receiving circuit further includes:
      a phase shifter for producing first and second received radio-frequency signals of phases shifted by 90° from each other in response to the received radio-frequency signal sent from said antenna, and applying said first received radio-frequency signal to said first even harmonic mixer;
      a second even harmonic mixer for mixing said received radio-frequency signal with the local oscillation signal sent from said local oscillator, and producing a second base band signal of a phase shifted by 90° from that of said first base band signal;
      a third high-pass filter for receiving the second base band signal from said second even harmonic mixer, and having said first cut-off frequency;

a second variable gain amplifier for amplifying the second base band signal passed through said third high-pass filter to obtain a constant output level; and a fourth high-pass filter for receiving the second base band signal from said second variable gain amplifier, and having said second cut-off frequency.

3. The wireless terminal device according to claim 1, further comprising:

a transmitting circuit for producing a transmitting radio-frequency signal having a frequency different from that of said received radio-frequency signal; and a transmission/reception branching filter for sending the transmitting radio-frequency signal sent from said transmitting circuit to said antenna, and simultaneously sending the received radio-frequency signal sent from said antenna to said receiving circuit.

4. The wireless terminal device according to claim 1, wherein said receiving circuit further includes a low-noise amplifier for amplifying and applying said received radio-frequency signal to said first even harmonic mixer.

5. The wireless terminal device according to claim 1, wherein said receiving circuit further includes a low-pass filter for receiving the first base band signal sent from said first even harmonic mixer, and applying the first base band signal to said first high-pass filter.

6. The wireless terminal device according to claim 1, wherein said receiving circuit further includes a low-noise amplifier for amplifying the first base band signal sent from said first even harmonic mixer, and applying the first base band signal to said first high-pass filter.

7. A wireless terminal device comprising:

an antenna;

a local oscillator;

an even harmonic orthogonal mixer for mixing a received radio-frequency signal sent from said antenna with a local oscillation signal sent from said local oscillator, and thereby produces an I-channel base band signal and a Q-channel base band signal;

a first high-pass filter for receiving the I-channel base band signal sent from said even harmonic orthogonal mixer, and having a first cut-off frequency;

a first variable gain amplifier for amplifying the I-channel base band signal passed through said first high-pass filter to obtain a constant output level;

a second high-pass filter for receiving the I-channel base band signal sent from said first variable gain amplifier, and having a second cut-off frequency higher than said first cut-off frequency;

a third high-pass filter for receiving the Q-channel base band signal sent from said even harmonic orthogonal mixer, and having said first cut-off frequency;

a second variable gain amplifier for amplifying the Q-channel base band signal passed through said third high-pass filter to obtain a constant output level; and a fourth high-pass filter for receiving the Q-channel base band signal sent from said second variable gain amplifier, and having said second cut-off frequency.

* * * * *